United States Patent
Carey et al.

(10) Patent No.: US 10,215,804 B2
(45) Date of Patent: Feb. 26, 2019

(54) SEMICONDUCTOR POWER AND PERFORMANCE OPTIMIZATION

(71) Applicant: International Business Machines Corporation, Armonk, NY (US)

(72) Inventors: Sean M. Carey, Hyde Park, NY (US); Kirk D. Peterson, Jericho, VT (US); Andrew A. Turner, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 90 days.

(21) Appl. No.: 15/220,730

(22) Filed: Jul. 27, 2016

(65) Prior Publication Data

US 2018/0031630 A1   Feb. 1, 2018

(51) Int. Cl.
  *G01R 31/3177*  (2006.01)
  *G01R 31/317*  (2006.01)
  *G06F 1/08*  (2006.01)
  *G01R 31/3185*  (2006.01)
  *G06F 17/50*  (2006.01)
  (Continued)

(52) U.S. Cl.
  CPC ... *G01R 31/3177* (2013.01); *G01R 31/31703* (2013.01); *G01R 31/31704* (2013.01); *G01R 31/31725* (2013.01); *G01R 31/31727* (2013.01); *G01R 31/318522* (2013.01); *G01R 31/318525* (2013.01); *G01R 31/318552* (2013.01); *G06F 1/08* (2013.01); *G06F 1/324* (2013.01); *G06F 1/3206* (2013.01); *G06F 1/3296* (2013.01); *G06F 17/50* (2013.01); *G01R 31/318342* (2013.01)

(58) Field of Classification Search
  CPC .......... G01R 31/3177; G01R 31/31727; G01R 31/31725; G01R 31/318522; G01R 31/318525; G01R 31/318552; G06F 1/08
  USPC ........................ 714/734, 731, 724, 736, 742
  See application file for complete search history.

(56) References Cited

U.S. PATENT DOCUMENTS

| | | | | |
|---|---|---|---|---|
| 4,800,564 A | * | 1/1989 | DeFazio | G01R 31/31858 714/814 |
| 4,811,343 A | * | 3/1989 | Johansson | G01R 31/3016 714/55 |

(Continued)

OTHER PUBLICATIONS

Friedman. Clock Distribution Networks in Synchronous Digital Integrated Circuits, May 2001, IEEE, vol. 89, No. 5, pp. 665-692.*

(Continued)

*Primary Examiner* — John J Tabone, Jr.
(74) *Attorney, Agent, or Firm* — Cantor Colburn LLP; Steven Meyers

(57) ABSTRACT

Embodiments are directed to a method and system for testing and optimizing integrated circuit devices. Latches within an integrated circuit device that fail to operate properly are found using observed data from a test. Thereafter, a directed graph of the layout of the integrated circuit is used to find clock controllers that feed into the latches. The clock controllers that are the most likely to be at issue are ranked, then testing can be performed to confirm that a critical path can be found. The critical path can be excluded from further power optimization to maintain the performance of the integrated circuit device. Other embodiments are also disclosed.

20 Claims, 6 Drawing Sheets

(51) Int. Cl.
*G06F 1/3206* (2019.01)
*G06F 1/324* (2019.01)
*G06F 1/3296* (2019.01)
*G01R 31/3183* (2006.01)

(56) References Cited

U.S. PATENT DOCUMENTS

| | | | | |
|---|---|---|---|---|
| 5,608,645 | A * | 3/1997 | Spyrou | G06F 1/10 |
| | | | | 716/113 |
| 6,785,413 | B1 * | 8/2004 | Barcomb | G01R 31/318511 |
| | | | | 382/149 |
| 7,460,922 | B1 | 12/2008 | Singh et al. | |
| 7,865,790 | B1 * | 1/2011 | Jairam | G01R 31/31725 |
| | | | | 714/726 |
| 7,908,532 | B2 * | 3/2011 | Eckelman | G01R 31/318544 |
| | | | | 714/726 |
| 8,024,696 | B1 * | 9/2011 | Srinivasan | G06F 17/5031 |
| | | | | 716/108 |
| 9,058,034 | B2 | 6/2015 | Bickford et al. | |
| 9,429,619 | B2 | 8/2016 | Anemikos et al. | |
| 9,602,083 | B2 | 3/2017 | Bollapalli et al. | |
| 2008/0158978 | A1 * | 7/2008 | Nishiyama | G11C 7/065 |
| | | | | 365/185.18 |
| 2009/0210763 | A1 * | 8/2009 | Eckelman | G01B 31/318536 |
| | | | | 714/731 |

OTHER PUBLICATIONS

Salman et al., Clock Skew Scheduling in the Presence of Heavily Gated Clock Networks, May 22, 2015, ACM, pp. 283-288.*

Hussain, et al., "Block Remap with Turnoff: A Variation-Tolerant Cache Design Technique", Proceedings of the 2008 Asia and South Pacific Design Automation Conference, 2008, pp. 783-788, IEEE Computer Society Press Los Alamitos, CA, USA.

Shen, et al., "A New Voltage Binning Technique for Yield Improvement Based on Graph Theory", 13th Int'l Symposium on Quality Electronic Design, 2012, pp. 243-248, IEEE, USA.

* cited by examiner

SEMICONDUCTOR POWER AND PERFORMANCE OPTIMIZATION

BACKGROUND

The present disclosure relates in general to integrated circuit devices. More specifically, the present disclosure relates to the testing and evaluation of integrated circuit devices.

After an integrated circuit device has been fabricated, it is tested to determine if the integrated circuit device is operational and if it meets specification. In some instances, a manufacturer might distribute multiple versions of an integrated circuit device, which all emerge from the same production line. Prior to distribution, an integrated circuit device is tested to determine which marking it should retrieve. For example, a manufacturer might distribute a microprocessor with a 3.5 GHz version, a 3.2 GHz version, and a 3.0 GHz version. If a particular microprocessor passes the 3.5 GHz test, it is sold as a 3.5 GHz processor. Otherwise, it is determined if the processor passes the 3.2 GHz test. If so, it is sold as a 3.2 GHz processor. This is repeated at 3.0 GHz. A more efficient method of testing integrated circuit devices allows a manufacturer to reduce the number of failures, increase yield, and reduce power consumption.

SUMMARY

Embodiments are directed to a computer-implemented method. The method includes examining, by a processor, fail data of an integrated circuit device to determine which latches of the integrated circuit device are underperforming. Thereafter, the processor analyzes a directed graph of the integrated circuit device to find clock controllers that feed into the latches that are underperforming. A test plan is created to test the clock controllers. The test plan is then performed to find the clock controllers that are in a critical path.

Embodiments are further directed to a computer system. The computer system comprises a memory and a processor system coupled to the memory. The processor system is configured to perform a method. The method includes examining fail data of an integrated circuit device to determine which latches of the integrated circuit device are underperforming. Thereafter, the processor analyzes a directed graph of the integrated circuit device to find clock controllers that feed into the latches that are underperforming. A test plan is created to test the clock controllers. The test plan is then performed to find the clock controllers that are in a critical path.

Embodiments are further directed to a computer program product. The computer program product includes a computer-readable storage medium having program instructions embodied therewith. The computer-readable storage medium is not a transitory signal per se. The program instructions are readable by a processor system to cause the processor system to perform a method. The method comprises includes examining fail data of an integrated circuit device to determine which latches of the integrated circuit device are underperforming. Thereafter, the processor analyzes a directed graph of the integrated circuit device to find clock controllers that feed into the latches that are underperforming. A test plan is created to test the clock controllers. The test plan is then performed to find the clock controllers that are in a critical path.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Turning now to an overview of the present disclosure, one or more embodiments provide a methodology for improving the ability to test integrated circuit devices and improve the performance by quickly finding the critical path of the integrated circuit device and performing corrections.

An average integrated circuit device is a product of manufacturing variance and the distribution of timing margin from various paths internal to the integrated circuit device. The integrated circuit device is often limited by the slowest portion of the integrated circuit device. For example, there might be an exemplary integrated circuit device with four cores. In a first sample device, there might be two "fast" cores (e.g., 3.5 GHz in the embodiment described above) and two "medium speed" cores (e.g., 3.2 GHz). In a second sample device, there might be two "medium speed" (3.2 GHz) cores, one "fast" (3.5 GHz) core and one "slow" (3.0 GHz) core. The second sample device might be limited to run at the slow speed, even though three of the cores operate faster than the slow speed, because of the need to slow down to wait for the slow core. An alternative would be to run the "slow" core at a higher voltage to increase its speed. This has the downside of negatively affecting the reliability and power consumption of the integrated circuit device as a whole.

The "critical path" of an integrated circuit device is the path that causes the slow performance of the integrated circuit device. If a manufacturer is able to improve the performance of the critical path, the performance of the entire integrated circuit device increases. While knowing that a particular core is slow is helpful, it might be more helpful to determine which part of the core is causing the problem, all the way down to the individual latch level.

Figure 1:
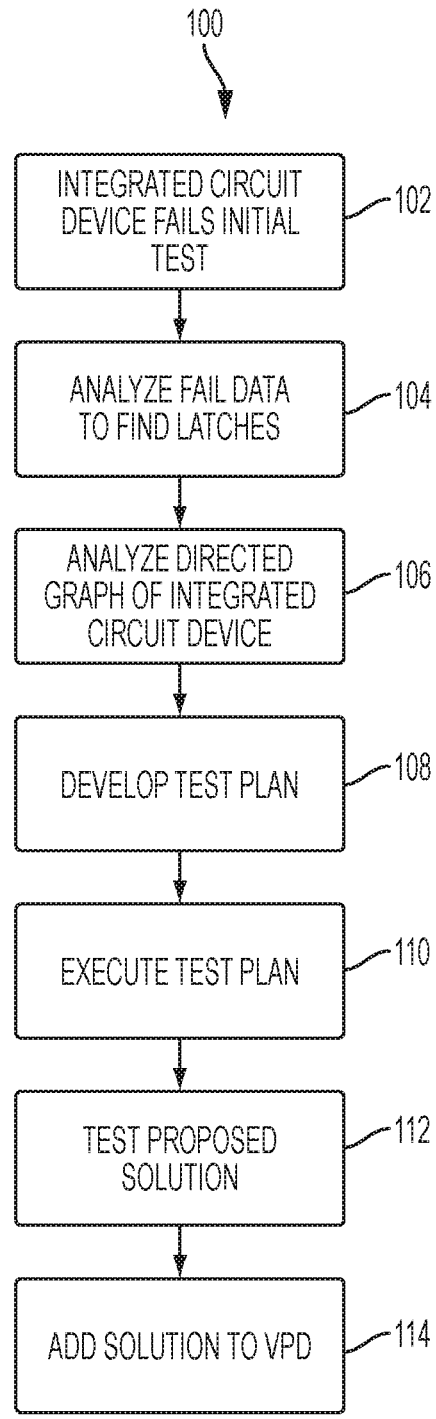
FIG. 1 depicts a flow diagram of a method of an exemplary embodiment.

A flowchart illustrating an overview of a method 100 for testing an integrated circuit device is presented in FIG. 1. Method 100 is merely exemplary and is not limited to the embodiments presented herein. Method 100 can be employed in many different embodiments or examples not specifically depicted or described herein. In some embodiments, the procedures, processes, and/or activities of method 100 can be performed in the order presented. In other embodiments, the procedures, processes, and/or activities of method 100 can be performed in any other suitable order. In still other embodiments, one or more of the procedures, processes, and/or activities of method 100 can be combined or skipped.

Method 100 is performed on an integrated circuit device that has already been fabricated (as opposed to being a theoretical test). Method 100 can be performed by a computer system 500. An integrated circuit device fails to pass an initial test (block 102). There can be many different types of tests performed as an initial test, both those that currently exist and those developed in the future. The initial test is configured such that there are many observation points, where the values of individual latches (in this specification, "latch" will be a generic term for a portion of the integrated circuit device being tested, whether or not it is technically a flip-flop). In such a manner, the fail data of the integrated circuit device might include the value of each latch, along with the intended value of the latch. The fail data is analyzed to determine which latches are failing (block 104). A directed graph of the integrated circuit device is analyzed to determine which clock controllers of the semiconductor are responsible for each of the failing latch(es) (block 106). The clock controllers are analyzed to determine if a particular clock controller might be responsible for multiple failed latches. An isolation test plan is built that ranks the domains most likely to capture the defective signal (block 108). The isolation test plan is applied by searching for clock domains that appropriately alleviate the lack of timing margin (block 110). Margin tests are run with the proposed solution (block 112). Thereafter, the solution is added to the vital product data (VPD) of the integrated circuit device (block 114). VPD is a collection of configuration and informational data associated with a particular integrated circuit device. VPD can be burned into an EEPROM associated with the integrated circuit device such that certain operating parameters of the integrated circuit device are adjusted during operation. VPD also can be physically located on the integrated circuit device as a series of fuses. In some embodiments, VPD can be software-based, where the instructions provided by the software are implemented upon boot.

Figure 2A:
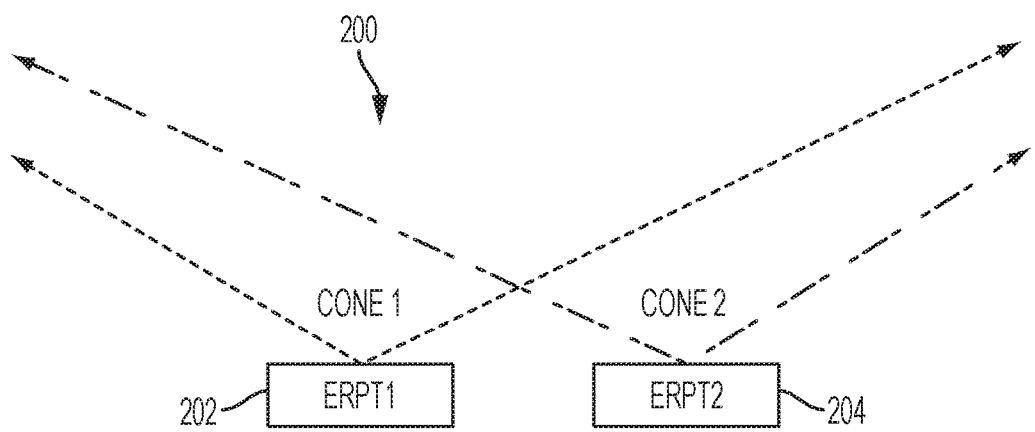
FIG. 2A depicts a directed graph of two latches of an integrated circuit device being tested.
Figure 2B:
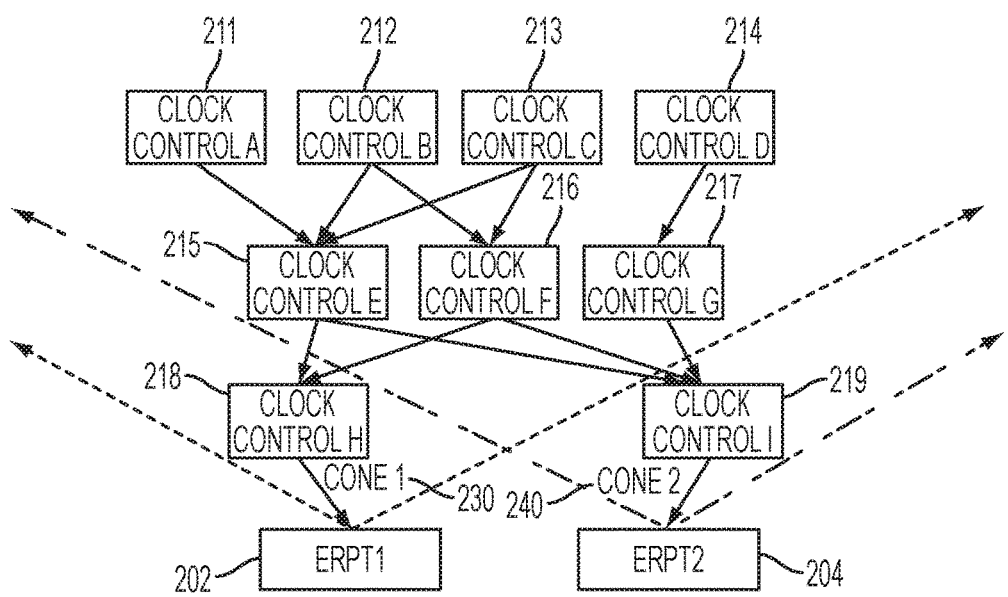
FIG. 2B depicts a directed graph of two latches of an integrated circuit device being tested along with clock controller circuits that feed into the latches.

Turning now to FIGS. 2A and 2B, to further elaborate on the above-given steps, a directed graph of an exemplary integrated circuit device 200 being tested is illustrated. A directed graph is produced based on the schematic layout of the integrated circuit device. It will be assumed that the integrated circuit device being discussed did not perform as expected in an initial test. The "fail data" of the integrated circuit device is analyzed and it is determined that two particular latches 202 and 204 of the integrated circuit device are found to have erroneous data. The directed graph illustrates each clock control circuit that feeds into latches 202 and 204. The result is shown in FIG. 2B.

In FIG. 2B, nine clock control circuits are illustrated— clock control A through clock control I (elements 211 through 219). The relationship between each clock control circuit is determined, resulting in the arrows between the various clock control circuits. The arrows indicate which clock controllers affect other clock controllers. For example, clock controller E (element 215) receives input from clock controllers A, B, and C. However, clock controller G only receives input from clock controller D. A cone is a theoretical construct that contains each clock control circuit that effect the latches at issue. The cones created in FIG. 2B are cone 230 for latch 202 and cone 240 for latch 204. It should be understood that FIG. 2B is a greatly simplified version of a directed graph. An actual directed graph from a complex integrated circuit device might have dozens or even hundreds of clock controllers.

Of interest here is the intersection of cone 230 with cone 240. Because both clock controller H (element 218) and clock controller I (element 219) each only affect one latch (latch 202 and latch 204, respectively), they are not located within the intersection of cone 230 and cone 240. However, each of the other clock controls, elements 211 through 217, are within the intersection of cone 230 and 240.

Other clock controls also can be eliminated from consideration. For example, clock controller D (element 214) and clock controller G (clement 217) do not connect to latch 202, so are probably not relevant to this discussion. The clock controllers that are relevant to this particular integrated circuit device can be selected from elements 211, 212, 213, 215, and 216 because these are the clock controllers that affect both latch 202 and latch 204. This process can be considered the building of an isolation test plan.

Refinements can be performed to narrow down the clock controller at issue even further. For example, a performance screen ring oscillator (PSRO) analysis can be performed on the integrated circuit device. The PSRO analysis can provide a result gradient that indicates if certain areas of the integrated circuit device are faster than other areas, simply due to manufacturing variations. With reference to FIG. 2B, in this example, a PSRO analysis might reveal that elements get slower at the top left of the integrated circuit device (toward element 211) and faster toward the bottom right of the integrated device (toward element 217).

In addition to the above, simulation data can be used to provide a first guess of the best place to start an analysis. In the design phase of an integrated circuit device, circuits are simulated using special timing models to predict the timing behavior. When the timing slack (margin to a clocked point) is positive, then it has time that could be "borrowed" and applied to adjacent segments in the path. When the timing slack is negative, then it might fail and need more time to correctly evaluate the associated logic state. In summary, if there are too many paths to analyze in the logic graph, the timing data can be a key piece of data to interpret along with the logical and physical organization of the circuit feeding the observe points (the failing latches or other portions observed to be slow.).

Timing data is not always able to predict how things occur in the real world, so paths must be chosen not only on their predicted timing but on other merits, such as: 1) being on a slow part of the chip (determined via PSO); 2) being logically near the observe point(s) (the further away the critical path is from the observe point the less probable it becomes and the more probable the fault would have been observed differently . . . of course with caveats); or 3) being proven to be in the critical path from previous data (either from previous runs of this method or external characterization/experimental data).

To summarize, the components feeding into the judgment of the components that most likely comprise the critical path (and therefore determine the test plan) include the following: 1) how the circuits are logically organized feeding the failing latches (for cones and clock controllers); 2) how the circuits are physically organized feeding the failing latches (for interpretation of other test data such as PSRO); 3) how the circuits are predicted to perform from simulation; and 4) how previous/a-priori data predicts the circuits to be limited.

Taking all this information into account, the clock controllers in the directed graph can be ranked to determine which clock controller to test first. In this case, it might make sense to start in the vicinity of latch 202 and 204, the observed slow latches. That would be clock controller H (element 218) and clock controller I (element 219). Even though both clock controller H and clock controller I only interact with one of the latches, it is possible that both clock controller H and clock controller I are underperforming.

If an analysis of clock controller H and clock controller I fails to find the culprit, the next item to be tested could be the clock controllers that feed into both clock controller H and clock controller I—clock controller E (element 215) and clock controller F (element 216). Because the PSRO analysis shows that elements to the left are slower than elements to the right, the next pass of the test might start with clock controller E first, then later proceed to clock controller F.

Once the clock controller that is causing the slowness is found (also known as the critical path), various processes can be performed to improve the performance of the integrated circuit. Many different processes can be performed, both those already in existence and those developed in the future. Embodiments are not limited to any such process. An exemplary process is "cycle stealing." In such a process, clock cycles can be adjusted to account for the critical path of a circuit that is slower. For example, if a certain process is supposed to take 2 nanoseconds at a particular clock controller, but it is determined that, due to fabrication variations, the clock controller requires 2.1 nanoseconds, then 0.1 nanoseconds of time can be taken from another clock controller (that is able to perform with 0.1 nanoseconds less time) and used for the slow clock controller.

In addition, the clock controller at issue can be noted such that any type of power optimization (lowering the voltage of certain parts of the integrated circuit device) does not affect the clock controller at issue. This will be discussed further with respect to FIG. 3.

Figure 3:
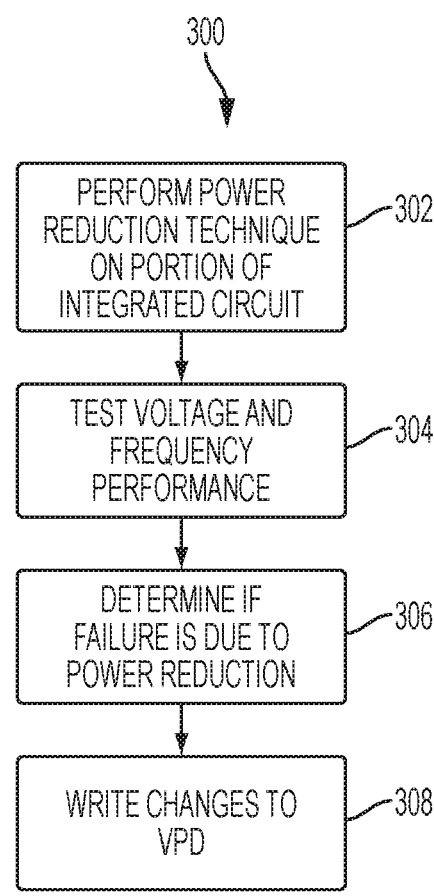
FIG. 3 depicts a flow diagram of a method of an exemplary embodiment.

A flowchart illustrating a method 300 of performing a power optimization technique is presented in FIG. 3. Method 300 is merely exemplary and is not limited to the embodiments presented herein. Method 300 can be employed in many different embodiments or examples not specifically depicted or described herein. In some embodiments, the procedures, processes, and/or activities of method 300 can be performed in the order presented. In other embodiments, the procedures, processes, and/or activities of method 300 can be performed in any other suitable order. In still other embodiments, one or more of the procedures, processes, and/or activities of method 300 can be combined or skipped.

Generally speaking, a manufacturer wants to lower the power consumption of integrated circuit devices. Lower power consumption means lower temperatures of the integrated circuit device and can lead to a longer lifespan of the integrated circuit device. In addition, a reduced power consumption can lead to a longer battery life. In an integrated circuit device, one method of reducing the power consumption of the integrated circuit device as a whole is to reduce the power consumption of individual latches or clock controllers of the integrated circuit device.

If an integrated circuit device fails a test, then typically method 300 will be performed after method 100. However, method 300 can also be performed on an integrated circuit device that passes a test. Method 300 can be performed by a computer system 500. At block 302, a power reduction technique is performed on a portion of an integrated circuit device. This involves modifying a portion of the integrated circuit device (such as a clock controller or a latch) such that the portion uses less voltage. The voltage and frequency performance of the integrated circuit device is evaluated (block 304). If the integrated circuit device still performs properly, the method can continue at block 302. In the case of a failure of the integrated device to pass a test, it is determined if the failure is due to the power reduction (block 306). In such a manner, different portions of the integrated circuit device can have lowered voltage until the power consumption of the device is minimized. The critical path (determined earlier with respect to FIG. 1) can be untouched by the power optimization process. In other words, since latches 202 and 204 were found to be part of the critical path, the power to those latches remains unchanged. Thereafter, changes can be committed to a VPD in a manner similar to that described above (block 308).

It should also be understood that the process described with respect to FIG. 3 can be performed in an attempt to induce a failure in an integrated circuit device. This might be done if prior testing has shown a weakness in other integrated circuit devices with respect to certain areas of the integrated circuit device. The power reduction process of FIG. 3 can be applied to those areas of each fabricated integrated circuit device to see if it exhibits the same behavior.

Figure 4:
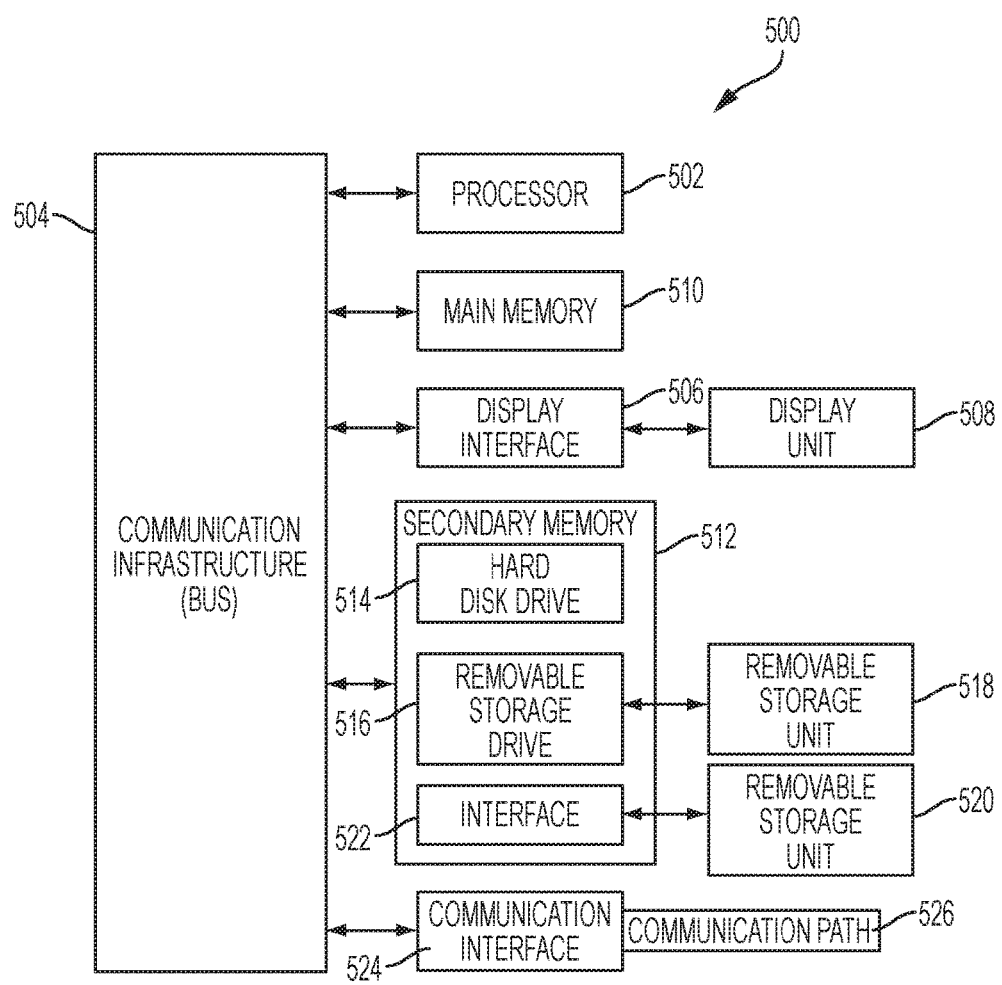
FIG. 4 is a block diagram of a computer system capable of performing an embodiment.

FIG. 4 depicts a high-level block diagram computer system 500, which may be used to implement one or more embodiments of the present invention. More specifically, computer system 500 may be used to implement hardware components of systems capable of performing methods described herein. Although one exemplary computer system 500 is shown, computer system 500 includes a communication path 526, which connects computer system 500 to additional systems (not depicted) and may include one or more wide area networks (WANs) and/or local area networks (LANs) such as the Internet, intranet(s), and/or wireless communication network(s). Computer system 500 and additional system are in communication via communication path 526, e.g., to communicate data between them.

Computer system 500 includes one or more processors, such as processor 502. Processor 502 is connected to a communication infrastructure 504 (e.g., a communications bus, cross-over bar, or network). Computer system 500 can include a display interface 506 that forwards graphics, textual content, and other data from communication infrastructure 504 (or from a frame buffer not shown) for display on a display unit 508. Computer system 500 also includes a main memory 510, preferably random access memory (RAM), and may also include a secondary memory 512. Secondary memory 512 may include, for example, a hard disk drive 514 and/or a removable storage drive 516, representing, for example, a floppy disk drive, a magnetic tape drive, or an optical disc drive. Hard disk drive 514 can be in the form of a solid state drive (SSD), a traditional magnetic disk drive, or a hybrid of the two. There also may be more than one hard disk drive 514 contained within secondary memory 512. Removable storage drive 516 reads from and/or writes to a removable storage unit 518 in a manner well known to those having ordinary skill in the art. Removable storage unit 518 represents, for example, a floppy disk, a compact disc, a magnetic tape, or an optical disc, etc. which is read by and written to by removable storage drive 516. As will be appreciated, removable storage unit 518 includes a computer-readable medium having stored therein computer software and/or data.

In alternative embodiments, secondary memory 512 may include other similar means for allowing computer programs or other instructions to be loaded into the computer system. Such means may include, for example, a removable storage unit 520 and an interface 522. Examples of such means may include a program package and package interface (such as that found in video game devices), a removable memory chip (such as an EPROM, secure digital card (SD card), compact flash card (CF card), universal serial bus (USB) memory, or PROM) and associated socket, and other removable storage units 520 and interfaces 522 which allow software and data to be transferred from the removable storage unit 520 to computer system 500.

Computer system 500 may also include a communications interface 524. Communications interface 524 allows software and data to be transferred between the computer system and external devices. Examples of communications interface 524 may include a modem, a network interface (such as an Ethernet card), a communications port, or a PC card slot and card, a universal serial bus port (USB), and the like. Software and data transferred via communications interface 524 are in the form of signals which may be, for example, electronic, electromagnetic, optical, or other signals capable of being received by communications interface 524. These signals are provided to communications interface 524 via a communication path (i.e., channel) 526. Communication path 526 carries signals and may be implemented using wire or cable, fiber optics, a phone line, a cellular phone link, an RF link, and/or other communications channels.

In the present disclosure, the terms "computer program medium," "computer usable medium," and "computer-readable medium" are used to generally refer to media such as main memory 510 and secondary memory 512, removable storage drive 516, and a hard disk installed in hard disk drive 514. Computer programs (also called computer control logic) are stored in main memory 510 and/or secondary memory 512. Computer programs may also be received via communications interface 524. Such computer programs, when run, enable the computer system to perform the features of the present disclosure as discussed herein. In particular, the computer programs, when run, enable processor 502 to perform the features of the computer system. Accordingly, such computer programs represent controllers of the computer system. Thus it can be seen from the forgoing detailed description that one or more embodiments of the present disclosure provide technical benefits and advantages.

Figure 5:
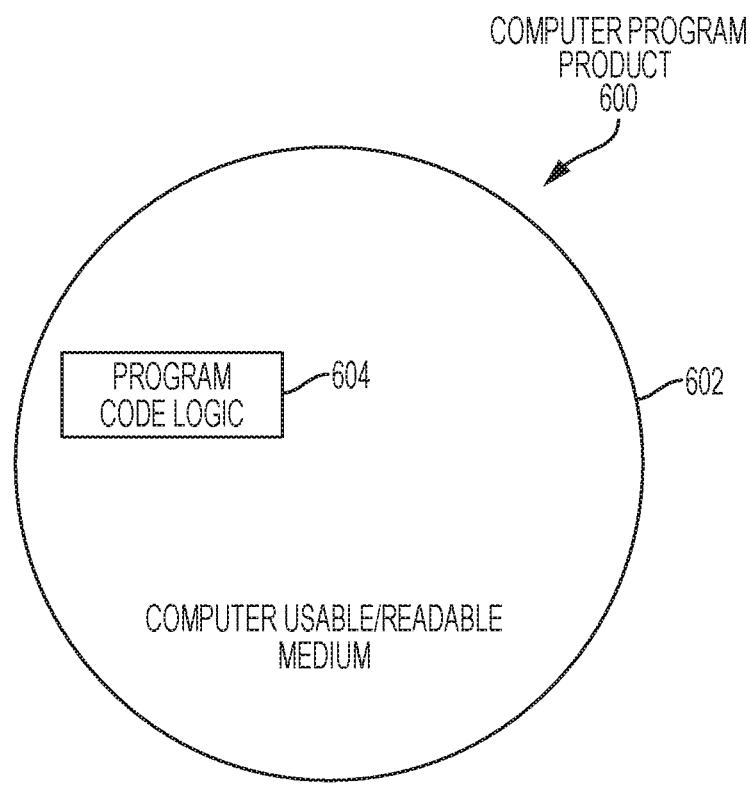
FIG. 5 is a block diagram of a computer program product capable of performing an embodiment.

Referring now to FIG. 5, a computer program product 600 in accordance with an embodiment that includes a computer-readable storage medium 602 and program instructions 604 is generally shown.

The present disclosure may be a system, a method, and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may include assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer-readable program instructions may execute entirely on the entity's computer, partly on the entity's computer, as a stand-alone software package, partly on the entity's computer and partly on a remote computer or entirely on the remote computer or server. In the latter scenario, the remote computer may be connected to the entity's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

It should be understood that, while portions of this disclosure discuss certain types of integrated circuit devices, this disclosure is applicable to any type of integrated circuit devices, including processors, system on a chip, microcontrollers, memory, converters, interfaces, and the like.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method comprising:
    examining, by a processor, fail data of an integrated circuit device to determine which latches of the integrated circuit device are underperforming;
    analyzing, by the processor, a directed graph of the integrated circuit device to find clock controllers that feed into the latches that are underperforming;
    creating, using the processor, a test plan to test the clock controllers that feed into the latches that are underperforming; and
    performing, using the processor, the test plan to find the clock controllers, among the clock controllers that feed into the latches that are underperforming, that are in a critical path, wherein the critical path causes slow performance of the integrated circuit device.

2. The computer-implemented method of claim 1 further comprising:
    testing a proposed solution to address the slow performance of the integrated circuit device based on the clock controllers in the critical path; and
    writing the proposed solution to a vital product data (VPD).

3. The computer-implemented method of claim 2 wherein, the proposed solution is a timing correction to the clock controllers in the critical path.

4. The computer-implemented method of claim 2 wherein, the VPD comprises a set of operating parameters applied to the integrated circuit device prior to operation.

5. The computer-implemented method of claim 1, wherein the test plan to test the clock controllers tests the clock controllers in order of a likelihood of the clock controller being part of the critical path.

6. The computer-implemented method of claim 5 further comprising:
    using a performance screen ring oscillator (PSRO) analysis to aid in the creation of the test plan, wherein the PSRO analysis comprises an analysis that determines a general performance of a latch on an integrated circuit device based on a location of the latch.

7. The computer-implemented method of claim 1 further comprising:
    performing a power optimization process to reduce power consumption of the integrated circuit device; wherein:
        the power optimization process comprises iteratively reducing power to areas of the integrated circuit device while ensuring the integrated circuit device meets performance specifications.

8. The computer-implemented method of claim 7 wherein, latches and clock controllers within the critical path are not included in the power optimization process.

9. A computer system comprising:
    a memory; and a processor system communicatively coupled to the memory;
    the processor system configured to perform a method comprising:
        examining fail data of an integrated circuit device to determine which latches of the integrated circuit device are underperforming;

analyzing a directed graph of the integrated circuit device to find clock controllers that feed into the latches that are underperforming;

creating a test plan to test the clock controllers that feed into the latches that are underperforming; and performing the test plan to find the clock controllers, among the clock controllers that feed into the latches that are underperforming, that are in a critical path, wherein the critical path causes slow performance of the integrated circuit device.

10. The computer system of claim 9 further comprising:

testing a proposed solution to the slow performance of the integrated circuit device based on the clock controllers in the critical path; and writing the proposed solution to a vital product data (VPD).

11. The computer system of claim 10 wherein, the proposed solution is a timing correction to the clock controllers in the critical path.

12. The computer system of claim 10 wherein, the VPD comprises a set of operating parameters applied to the integrated circuit device prior to operation.

13. The computer system of claim 9, wherein the test plan to test the clock controllers tests the clock controllers in order of a likelihood of the clock controller being part of the critical path.

14. The computer system of claim 13 further comprising:

using a performance screen ring oscillator (PSRO) analysis to aid in the creation of the test plan, wherein the PSRO analysis comprises an analysis that determines a general performance of a latch on an integrated circuit device based on a location of the latch.

15. The computer system of claim 9 further comprising:

performing a power optimization process to reduce power consumption of the integrated circuit device; wherein:

the power optimization process comprises iteratively reducing power to areas of the integrated circuit device while ensuring the integrated circuit device meets performance specifications.

16. The computer system of claim 15 wherein, latches and clock controllers within the critical path are not included in the power optimization process.

17. A computer program product comprising:

a computer-readable storage medium having program instructions embodied therewith, wherein the computer-readable storage medium is not a transitory signal per se, the program instructions readable by a processor system to cause the processor system to perform a method comprising:

examining, by a processor, fail data of an integrated circuit device to determine which latches of the integrated circuit device are underperforming;

analyzing, by the processor, a directed graph of the integrated circuit device to find clock controllers that feed into the latches that are underperforming;

creating, using the processor, a test plan to test the clock controllers that feed into the latches that are underperforming; and performing, using the processor, the test plan to find the clock controllers, among the clock controllers that feed into the latches that are underperforming, that are in a critical path, wherein the critical path causes slow performance of the integrated circuit device.

18. The computer program product of claim 17 further comprising:

testing a proposed solution to the slow performance of the integrated circuit device based on the clock controllers in the critical path; and writing the proposed solution to a vital product data (VPD).

19. The computer program product of claim 17, further comprising:

using a performance screen ring oscillator (PSRO) analysis to aid in the creation of the test plan, wherein the PSRO analysis comprises an analysis that determines a general performance of a latch on an integrated circuit device based on a location of the latch; and wherein:

the test plan to test the clock controllers tests the clock controllers in order of a likelihood of the clock controller being part of the critical path.

20. The computer program product of claim 17 further comprising:

performing a power optimization process to reduce power consumption of the integrated circuit device; wherein:

the power optimization process comprises iteratively reducing power to areas of the integrated circuit device while ensuring the integrated circuit device meets performance specifications.

* * * * *